(12) United States Patent
Hsu et al.

(10) Patent No.: US 11,204,614 B2
(45) Date of Patent: Dec. 21, 2021

(54) CURRENT BALANCE CIRCUIT (71) Applicant: Taiwan Semiconductor Manufacturing Company Limited, Hsinchu (TW)

(72) Inventors: Ying-Chih Hsu, Hsinchu (TW); Alan Roth, Leander, TX (US); Eric Soenen, Austin, TX (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 400 days.

(21) Appl. No.: 16/145,308

(22) Filed: Sep. 28, 2018

(65) Prior Publication Data

US 2019/0129456 A1    May 2, 2019

Related U.S. Application Data

(60) Provisional application No. 62/577,813, filed on Oct. 27, 2017.

(51) Int. Cl.
*G05F 1/575* (2006.01)
*G05F 1/59* (2006.01)
(Continued)

(52) U.S. Cl.
CPC .............. *G05F 1/575* (2013.01); *G05F 1/59* (2013.01); *H02M 3/156* (2013.01); *H02M 3/158* (2013.01);
(Continued)

(58) Field of Classification Search
CPC ........ G05F 1/575; G05F 1/59; H02M 3/1584; H02M 3/156; H02M 3/158; H02M 2001/009; H03K 5/24
See application file for complete search history.

(56) References Cited

U.S. PATENT DOCUMENTS 6,278,263 B1 *   8/2001   Walters ..................... G06F 1/28
                                                323/272
6,912,144 B1 *   6/2005   Clavette .............. H02M 3/1584
                                                323/283
(Continued)

OTHER PUBLICATIONS

Tao Liu, Digitally Controlled DC-DC Buck Converters with Lossless Current Sensing, Dec. 2011, Arizona State University, pp. 11 and 17-18.*

*Primary Examiner* — Hal Kaplan
*Assistant Examiner* — Thai H Tran
(74) *Attorney, Agent, or Firm* — Jones Day (57) ABSTRACT

A current balance circuit including a current sensing front end for sensing an output signal from each of a plurality of switching regulators and a current sensor for receiving the sensed output signal and converting the sensed signal into a sensed current signal. The current balance circuit further includes a current averaging circuit for receiving the sensed output signals and determining an average current output for the plurality of switching regulators and a current difference circuit for receiving the average current value and the sensed current signals and determining a current difference for each of the plurality of switching regulators. A calibration circuit is included for receiving the current differences and calculating a calibration value corresponding to each of the plurality of switching regulators which provides an indication of how to adjust a current output of the plurality of switching regulators to balance the current across the plurality of switching regulators.

20 Claims, 4 Drawing Sheets

(51) Int. Cl.
*H03K 5/24* (2006.01)
*H02M 3/158* (2006.01)
*H02M 3/156* (2006.01)
*H02M 1/00* (2006.01)

(52) U.S. Cl.
CPC ............ *H02M 3/1584* (2013.01); *H03K 5/24* (2013.01); *H02M 1/009* (2021.05)

(56) References Cited

U.S. PATENT DOCUMENTS

| | | | |
|---|---|---|---|
| 7,019,507 B1* | 3/2006 | Dittmer | H02M 1/32 323/271 |
| 8,823,352 B2* | 9/2014 | Zhang | H02M 1/14 323/286 |
| 10,284,095 B1* | 5/2019 | Mednik | H02J 3/26 |
| 2002/0135338 A1* | 9/2002 | Hobrecht | H02J 1/102 323/272 |
| 2003/0185025 A1* | 10/2003 | Takemura | H02M 3/1584 363/65 |
| 2003/0201761 A1* | 10/2003 | Harris | H02J 1/102 323/272 |
| 2005/0128005 A1* | 6/2005 | Li | H03F 3/04 330/297 |
| 2005/0225307 A1* | 10/2005 | Sato | H02M 3/1584 323/282 |
| 2006/0043947 A1* | 3/2006 | Clavette | H02M 3/158 323/282 |
| 2007/0296387 A1* | 12/2007 | Dong | H02M 3/157 323/285 |
| 2009/0051334 A1* | 2/2009 | Huang | H02M 3/1584 323/247 |
| 2009/0146643 A1* | 6/2009 | Ostrom | H02M 3/156 324/123 R |
| 2009/0153110 A1* | 6/2009 | Huang | H02M 3/1584 323/271 |
| 2010/0127684 A1* | 5/2010 | Iliasevitch | H02M 3/1588 323/285 |
| 2014/0266111 A1* | 9/2014 | Lee | H02M 3/1584 323/282 |
| 2019/0129456 A1* | 5/2019 | Hsu | G05F 1/59 |

* cited by examiner

CURRENT BALANCE CIRCUIT

CROSS-REFERENCE TO RELATED APPLICATIONS

This application claims priority to U.S. Provisional Application No. 62/577,813, filed Oct. 27, 2017, which is incorporated herein by reference in its entirety.

TECHNICAL FIELD

This relates to electronic circuits and more particularly to current balance circuits for reducing a current offset between different phases of multiple phase power management circuits such as multiple phase switching regulators.

BACKGROUND

Modern electronic devices typically require some form of power management circuit to control the voltage and/or current delivered to the electronic device during use. For example, in some configurations, the power management circuit may be tasked with delivering a substantially constant voltage and varying amounts of current depending on the needs of the electronic device. These power management circuits may utilize switching regulators to deliver the desired power to the electronic device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Power management circuits may be designed to control the voltage and/or current delivered to an electronic device during use. In some embodiments, the power management circuit may be tasked with delivering a substantially constant voltage and varying amounts of current depending on the needs of the electronic device. These power management circuits may utilize switching regulators to deliver the desired power to the electronic device. In some embodiments, switching regulators may be capable of delivering constant voltage within a narrow current range but outside of the prescribed ranges, the switching regulator may not perform as desired. Electronic devices relying on these switching regulators may have highly dynamic current requirements. For example, in some embodiments, the electronic device may be a microprocessor which requires relatively little current when not in use or when being minimally used but relatively large amounts of current when being used heavily. In these situations, a single switching regulator may not be sufficient to meet the current requirements of electronic device.

Accordingly, in some embodiments, multiple switching regulators may be coupled together in parallel. Such a configuration of switching regulators may be referred to as a multiple phase switching regulator. In this manner, the multiple phase switching regular can deliver the desired voltage to the electronic device and meet the highly dynamic current requirements of the electronic device. When multiple switching regulators are utilized, it may be desirable to control the current provided by the individual switching regulators such that the individual switching regulars are delivering a balanced (e.g., equal, substantially equal, and/or proportional) amount of current to the electronic device. Accordingly, in some embodiments, the multiple phase switching regulator may include a current balance circuit configured to balance the current provided by the multiple switching regulators.

By balancing the current between the multiple phases of the multiple phase switching regulator, the current balance circuit may eliminate or reduce some of the non-ideal characteristics of the switching regulators, improve the overall stability of the multiple phase switching regulator, and/or reduce the overall power consumption of the multiple phase switching regulator.

Figure 1:
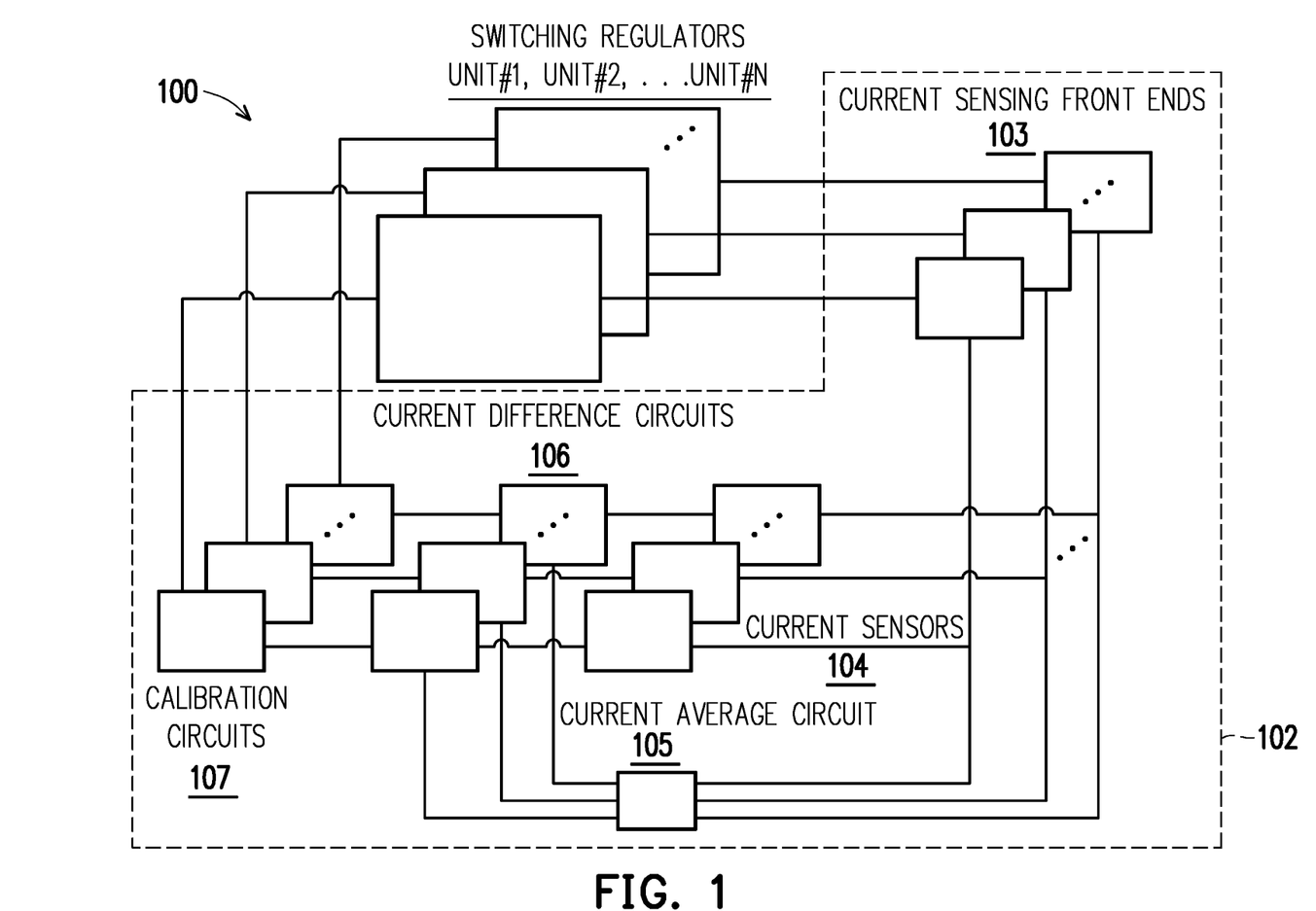
FIG. 1 is a schematic diagram illustrating an example of a current balance circuit for use in a multiple phase switching regulator in accordance with some embodiments.

FIG. 1 is a schematic diagram illustrating an example of a current balance circuit for use in a multiple phase switching regulator in accordance with some embodiments. As illustrated in the block diagram of FIG. 1, the circuit 100 includes multiple switching regulators (UNIT #1, UNIT #2, . . . UNIT #N) operating in parallel. A current balance circuit 102 is coupled to each of the multiple switching regulators (UNIT #1, UNIT #2, . . . UNIT #N). The current balance circuit 102 illustrated in this embodiment includes a current sensing front end 103, a current sensor 104, a current average circuit 105, a current difference circuit 106, and a calibration circuit 107 for each of the corresponding switching regulators (UNIT #1, UNIT #2, . . . UNIT #N). It should be noted that in the embodiment of FIG. 1, a single current average circuit 105 is utilized for the multiple switching regulators (UNIT #1, UNIT #2, . . . UNIT #N).

The switching regulators (UNIT #1, UNIT #2, . . . UNIT #N) may be configured to output a signal that has a constant voltage and a current within a predefined range. In some embodiments, the output of each of the switching regulators (UNIT #1, UNIT #2, . . . UNIT #N) may be a switching DC voltage that has a particular phase relative to the remaining switching regulators (UNIT #2, . . . UNIT #N).

The current balance cirucit 102 may be coupled to the switching regulators (UNIT #1, UNIT #2, . . . UNIT #N) in a feedback circuit configuration. Within the current balance circuit 102, the current sensing front ends 103 measures the output voltage of each switching regulator (UNIT #1, UNIT #2, . . . UNIT #N). The measured voltage is sent to the current sensors 104 for converting the measurements from the current sensing front ends 103 to corresponding current values. The measurement by the current sensing front ends 103 are also sent to the current average circuit 105 which outputs and an indication of the average current provided by the switching regulators (UNIT #1, UNIT #2, . . . UNIT #N). The output of the current sensors 104 and the current average circuit 105 are input into the current difference circuits 106 which calculate the difference between the actual current provided by each switching regulators (UNIT #1, UNIT #2, . . . UNIT #N) and the average current provided by the group of switching regulators (UNIT #1, UNIT #2, . . . UNIT #N). The difference is sent to the calibration circuit 107 which generates a calibration signal that is sent back to the respective switching regulator (UNIT #1, UNIT #2, . . . UNIT #N) so the switching regulators (UNIT #1, UNIT #2, . . . UNIT #N) can determine how much (if any) adjustment is necessary to the output of the switching regulator (UNIT #1, UNIT #2, . . . UNIT #N) to balance the current provided by the multiple switching regulators (UNIT #1, UNIT #2, . . . UNIT #N).

Figure 2:
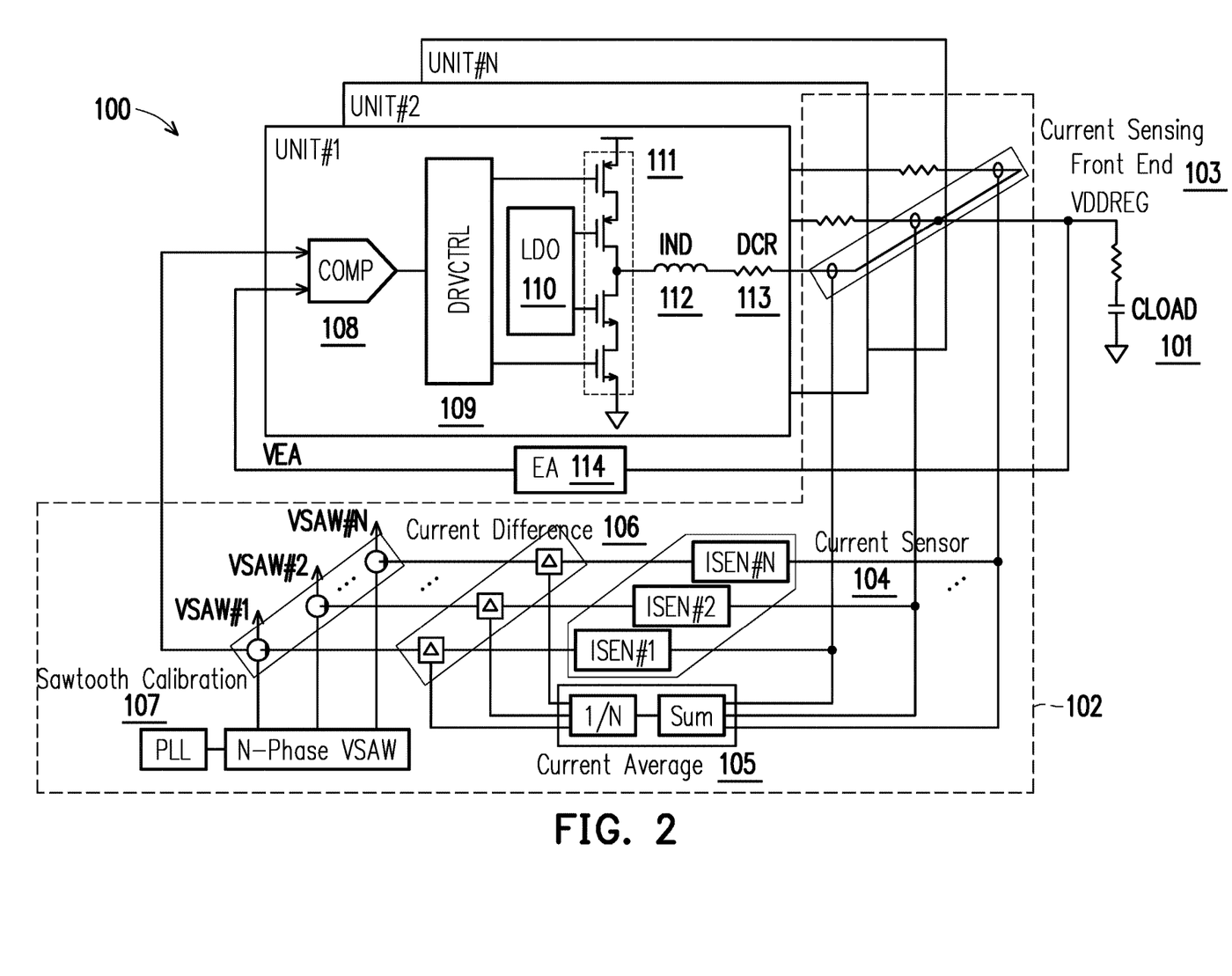
FIG. 2 is a schematic diagram illustrating an example of a current balance circuit for use in a multiple phase switching regulator in accordance with some embodiments.

FIG. 2 is a schematic diagram illustrating an example of a current balance circuit for use in a multiple phase switching regulator in accordance with some embodiments. As illustrated, the circuit 100 includes multiple switching regulators (UNIT #1, UNIT #2, . . . UNIT #N) operating in parallel and connected to a load 101. The load 101 is shown as a single resistor and capacitor for illustration purposes but in differing embodiments, the load may be any electronic device such as a microprocessor or something similar. In addition, FIG. 2 illustrates a current balance circuit 102 coupled to each of the multiple switching regulators (UNIT #1, UNIT #2, . . . UNIT #N). The current balance circuit 102 illustrated in this embodiment includes a current sensing front end 103, a current sensor 104, a current average circuit 105, a current difference circuit 106, and a calibration circuit 107.

The switching regulator UNIT #1 includes a comparator 108 for comparing the output of the calibration circuit 107 and the output of an error amplifier 114 and outputting a corresponding signal to the driver control 109. The driver control 109 and oscillator circuit 110 work together to drive the transistors 111 (e.g., MOS transistors) to create a switching DC voltage that has a particular phase relative to the remaining switching regulators (UNIT #2, . . . UNIT #N). The switching DC voltage is output to the load 101 via inductor 112 and resistor 113. The error amplifier 114 is part of the main feedback loop for the circuit 100. In operation, the error amplifier 114 measures the output voltage error and provides an amplified error signal to the switching regulators (UNIT #1, UNIT #2, . . . UNIT #N) for correction of the output voltage. While the detail of switching regulator UNIT #1 and the error amplifier 114 are only illustrated for UNIT #1, each of the switching regulators (UNIT #1, UNIT #2, . . . UNIT #N) may have corresponding structures or similar structures for performing the functions described herein.

Within the current balance circuit 102, the current sensing front end 103 measures the output voltage of each switching regulator (UNIT #1, UNIT #2, . . . UNIT #N). The measured voltage is sent to the current sensor 104 which includes multiple sensors (ISEN #1, ISEN #2, . . . ISEN #N) corresponding to the switching regulators (UNIT #1, UNIT #2, . . . UNIT #N) for converting the voltage measurement to a current value. The measurement by the current sensing front end 103 is also sent to the current average circuit 105 which sums the current output from each of the switching regulators (UNIT #1, UNIT #2, . . . UNIT #N) using a summer (SUM) and then divides the total current by the total number of switching regulators N using a divider circuit (1/N). The output of the current average circuit is an indication of the average current provided by the switching regulators (UNIT #1, UNIT #2, . . . UNIT #N). The output of the current sensor 104 and the current average circuit 105 are input into the current difference circuit 106 which calculates the difference between the actual current provided by each switching regulators (UNIT #1, UNIT #2, . . . UNIT #N) and the average current provided by the group of switching regulators (UNIT #1, UNIT #2, . . . UNIT #N). The difference is sent to the calibration circuit 107 which generates a calibration signal that is sent back to the respective switching regulator (UNIT #1, UNIT #2, . . . UNIT #N) so the switching regulators (UNIT #1, UNIT #2, . . . UNIT #N) can determine how much (if any) adjustment is necessary to the output of the switching regulator (UNIT #1, UNIT #2, . . . UNIT #N).

Figure 3:
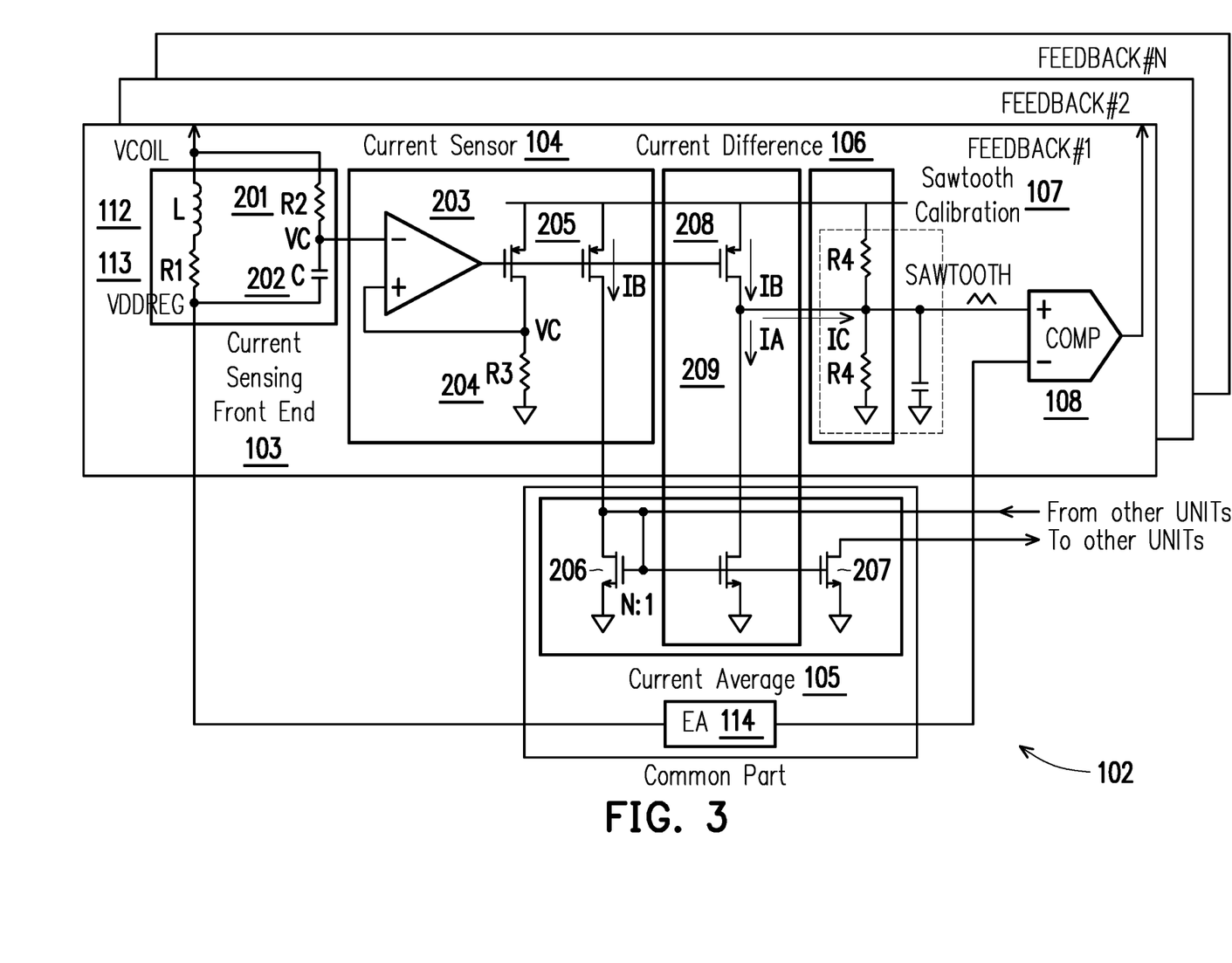
FIG. 3 is a more detailed circuit diagram illustrating an example of a current balance circuit for use in a multiple phase switching regulator in accordance with some embodiments.

FIG. 3 is a more detailed circuit diagram illustrating an example of a current balance circuit for use in a multiple phase switching regulator in accordance with some embodiments. In particular, FIG. 3 is a more detailed circuit diagram corresponding to the current balance circuit 102 illustrated in FIG. 2. The current balance circuit 102 includes a current sensing front end 103, a current sensor 104, a current difference circuit 106, and a calibration circuit 107 (collectively, FEEDBACK #1, FEEDBACK #2, . . . FEEDBACK #3) corresponding to each respective switching regulator (UNIT #1, UNIT #2, . . . UNIT #N). In addition, the current balance circuit 102 includes a single current average circuit 105 which serves all of the switching regulators (UNIT #1, UNIT #2, . . . UNIT #N).

In the current sensing front end 103, the output voltage (VDDREG) corresponds to the voltage applied to the load 101 (see FIG. 2). The current sensing front end includes an inductor (L) 112, a resistor (R1) 113, a sensing resistor (R2) 201, and a sensing capacitor (C) 202. The current sensing front end 103 measures the voltage (VC). According to the equations below, which describe the operation of the current sensing front end 103, the voltage (VC) is a linear function of the inductor (L) 112 current. Equation 1 below defines the general relationship between the various components in the current sensing front end 103, where the value (S) corresponds to the phase of the particular switching regulator.

$$VC - VDDREG \times (SC) \times R2 + VC = VDDREG + (IL) \times (SL + R1) \qquad \text{Equation 1}$$

The relationship can be rewritten by solving for VC:

$$VC = VDDREG + (IL \times R1) \times \frac{\frac{SL}{R1} + 1}{(SC)(R2) + 1} \qquad \text{Equation 2}$$

As can be seen, the voltage VC is still a function of the frequency or phase (S). However, with the value of (C)(R2)

is matched to the value of the L/R1, the voltage (VC) becomes independent of the frequency of phase and the voltage (VC) can be expressed as follows:

$$VC = VDDREG + (IL \times R1) \qquad \text{Equation 3}$$

Accordingly, in some embodiments, the current sensing front end may be configured such that the sensing capacitor (C) 202 and sensing resistor (R2) 201 are selected to satisfy the relationship (C)(R2)=L/R1.

The output voltage (VC) is input into the current sensor 104 which converts the voltage (VC) to a current value representative of the current generated by the specific switching regulator. As illustrated, the current sensor 104 includes a feedback amplifier 203, and a reference resistor (R3) 204 and a current source 205 which generates a current (IB). The output of the current sensor 104 is a current (TB). The relationship between the current (TB) and the voltage (VC) is:

$$IB = \frac{VC}{R3} = \frac{VDDREG}{R3} + \frac{IL \times R1}{R3} \qquad \text{Equation 4}$$

In some embodiments, the conversion from current (IL) to current (TB) assists with reducing the losses inherent in other current sensor designs, such as series circuits for current sensing.

The current average circuit 105 includes N current summation transistors 206 and a current averaging transistor 207. In operation, the current (IB) from the various switching regulators (UNIT #1, UNIT #2, . . . UNIT #N) are summed together using the transistors 207 by the common mode connection between the current sensor circuits and the average current (IA) is generated through a current mirror and connected back to each of the switching regulators (UNIT #1, UNIT #2, . . . UNIT #N). The average current (IA) can be represented by replacing the current IL by the summation of the multiple currents IL from each switching regulators (UNIT #1, UNIT #2, . . . UNIT #N) divided by the total number (N) of switching regulators, as follows:

$$IA = \frac{VDDREG}{R3} + \frac{\frac{\sum_{1}^{N} IL}{N} \times R1}{R3} \qquad \text{Equation 5}$$

Next, the current difference circuit 106 calculated the current difference (IC) between the current (IB) corresponding to the measured current of the particular switching regulator (UNIT #1, UNIT #2, . . . UNIT #N) and the average current (IA) as determined by the current average circuit 105. The current average circuit 105 includes a unit current branch 208 and an average current branch 209. The relationship between the measured (unit) current and the current difference (IC) can be represented as follows:

$$IC = IB - IA = \frac{IL \times R1}{R3} - \frac{\frac{\sum_{1}^{N} IL}{N} \times R1}{R3} = \frac{R1}{R3}\left(IL - \frac{\sum_{1}^{N} IL}{N}\right) \qquad \text{Equation 6}$$

In some embodiments, the current difference (IC) may also reduce the common-mode noise of the current balance circuits.

The calibration circuit 107 receives the difference current (IC) and generates a voltage offset (VOFFSET) using a parallel resistance ladder comprising resistors (R4) 210. As illustrated in FIG. 3, the calibration circuit 107 may be a sawtooth calibration circuit. In operation, the offset voltage (VOFFSET) is determined based on the following relationship:

$$VOFFSET = IC \times R4 = \frac{R1}{R3}\left(IL - \frac{\sum_{1}^{N} IL}{N}\right) \times R4 \qquad \text{Equation 7}$$

As a result, the dc offset voltage of the sawtooth generator is adjusted by the voltage of the voltage (VOFFSET). The voltage (VOFFSET) compensates the phase current by adjusting the current duty of the input voltage. Accordingly, if the voltage (VOFFSET) is positive (i.e., greater than zero), the SL on duty increases which causes the current IL to decrease. If the voltage (VOFFSET) is negative (i.e., less than zero), the SL on duty decreases which causes the current IL to increase. As a result, the VOFFSET can be used to adjust the current delivered by each of the individual switching regulators (UNIT #1, UNIT #2, . . . UNIT #N) such that the currents are balanced across the multiple switching regulators (UNIT #1, UNIT #2, . . . UNIT #N).

Although the description above focuses on the portion of the feedback circuit located in FEEDBACK #1, it should be understood that the same or similar circuitry is also present in the remaining portions of the feedback circuit (FEEDBACK #2 . . . FEEDBACK #3).

Figure 4:
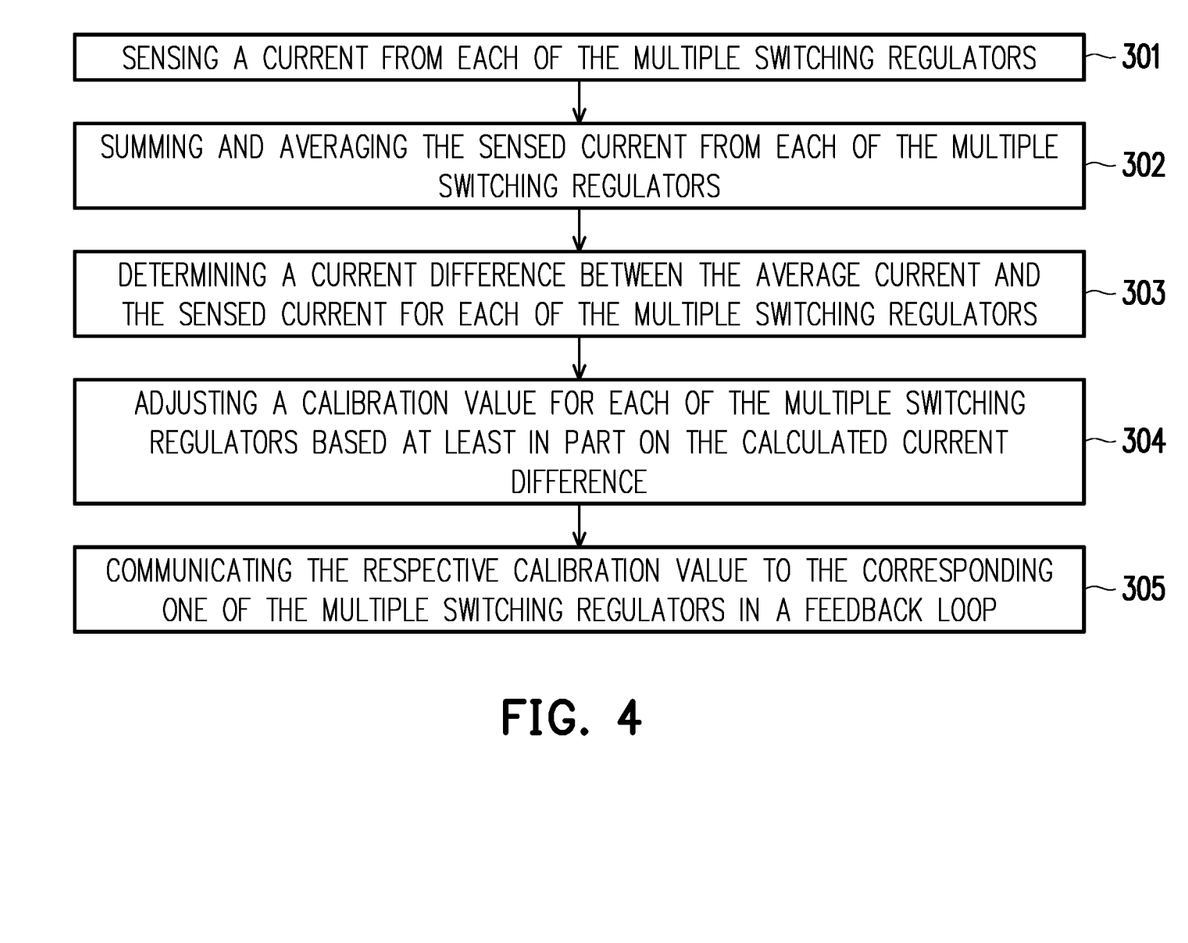
FIG. 4 is a flow diagram illustrating an operation of a current balance circuit for use in a multiple phase switching regulator in accordance with some embodiments.

FIG. 4 is a flow diagram illustrating an operation of a current balance circuit for use in a multiple phase switching regulator in accordance with some embodiments. For ease of understand, the process of FIG. 3 is described in conjunction with the examples in FIGS. 1-3, however, it should be understood that the process is application to additional embodiments as well. In operation 301 the current balance circuit 102 senses a current from each of the multiple switching regulators (UNIT #1, UNIT #2, . . . UNIT #N). As described above, sensing the output current of the switching regulators may include sensing an output voltage (VC) and converting the output voltage to a corresponding current (IB) using a current sensing frontend 103 and a current sensor 104. In operation 302, the current (IB) sensed from each of the multiple switching regulators (UNIT #1, UNIT #2, . . . UNIT #N) is summed and averaged (IA) by a current average circuit 105. Next, in operation 303, a current difference (IC) between the average current (IA) and the sensed current (IB) for each of the multiple switching regulators (UNIT #1, UNIT #2, . . . UNIT #N) is determined using a current difference circuit 106 associated with a respective switching regulator (UNIT #1, UNIT #2, . . . UNIT #N). In operation 304, the calculated current difference(IC) is used to adjust a calibration value (VOFFSET) for each of the multiple switching regulators (UNIT #1, UNIT #2, . . . UNIT #N) using a sawtooth calibration circuit 107. Finally, in operation 305, the calibration value (VOFFSET) is communicated to the corresponding one of the multiple switching regulators (UNIT #1, UNIT #2, . . . UNIT #N) in a feedback look.

As described herein, when multiple switching regulator are utilized in parallel, it may be desirable to control the current provided by the individual switching regulators such that the individual switching regulars are delivering a balanced (e.g., equal, substantially equal, and/or proportional) amount of current to the electronic device. The multiple phase switching regulators may include a current balance circuit configured to balance the current provided by the multiple phases. By balancing the current between the multiple phases of the multiple phase switching regulator, the current balance circuit described herein may eliminate or reduce some of the non-ideal characteristics of switching regulators, improve the overall stability of the multiple phase switching regulator, and/or reduce the overall power consumption of the multiple phase switching regulator.

Some embodiments described herein may include a current balance circuit comprising: a current sensing front end for sensing an output signal from each of a plurality of switching regulators; a current sensor for receiving the sensed output signal from each of the switching regulators and converting the sensed signal into a sensed current signal corresponding to an indication of the output current of the respective switching regulator; a current averaging circuit for receiving the sensed output signal from each of the switching regulators and determining an average current output for the plurality of switching regulators; a current difference circuit for receiving the average current value from the current averaging circuit and the sensed current signals and determining a current difference relative to the average current for each of the plurality of switching regulators; and a calibration circuit for receiving the current differences and calculating a calibration value corresponding to each of the plurality of switching regulators, the calibration values providing an indication of how to adjust a current output of the plurality of switching regulators such that the output current is balanced across the plurality of switching regulators.

Some embodiments described herein may include an electronic circuit comprising: a plurality of switching regulators coupled together in parallel, the plurality of switching regulators have a corresponding operation phase; and a current balance circuit for balancing the current output by each of the switching regulators. The current balance circuit may comprise: a current sensing front end for sensing an output voltage from each of a plurality of switching regulators; a current sensor for receiving the sensed output voltage from each of the switching regulators and converting the sensed output voltage into a sensed current signal corresponding to an indication of the output current of the respective switching regulator; a current averaging circuit for receiving the sensed output signal from each of the switching regulators and determining an average current output for the plurality of switching regulators; a current difference circuit for receiving the average current value from the current averaging circuit and the sensed current signals and determining a current difference relative to the average current for each of the plurality of switching regulators; and a sawtooth calibration circuit for receiving the current differences and calculating a voltage offset corresponding to each of the plurality of switching regulators, the voltage offset providing an indication of how to adjust a current output of the plurality of switching regulators such that the output current is balanced across the plurality of switching regulators.

Some embodiments described herein may include a method for balancing the current between multiple phases in a multiple phase switching regulator comprising: sensing a current from each of a plurality of switching regulators to obtain a sensed current value for each of the plurality of switching regulators; summing and averaging the sensed current from each of the plurality of switching regulators to obtain an average sensed current corresponding to the average current sensed from the plurality of switching regulators; determining a current difference between the averaged sensed current and the sensed current for each of the plurality of switching regulators; adjusting a calibration value for each of the plurality of switching regulators based at least in part on the current difference calculated for the respective plurality of switching regulators; and communicating the calibration value to the corresponding switching regulator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A current balance circuit comprising:
   a current sensing front end for sensing an output signal from each of a plurality of switching regulators;
   a current sensor for receiving the sensed output signal and converting the sensed signal into a sensed current signal corresponding to an indication of the output current of the respective switching regulator;
   a current averaging circuit for receiving the sensed output signal and determining an average current output for the plurality of switching regulators by using a plurality of current summation transistors to sum the sensed output signal from the plurality of switching regulators and a current mirror configured to determine the average current output;
   a current difference circuit for receiving the average current value and the sensed current signals and determining a current difference for each of the plurality of switching regulators; and
   a calibration circuit for receiving the current differences and generating a corresponding voltage value for calculating a calibration value corresponding to each of the plurality of switching regulators which is an indication of how to adjust a current output of the plurality of switching regulators such that the output current is balanced across the plurality of switching regulators.

2. The current balance circuit of claim 1, wherein the current sensing frontend and the current sensor are configured to reduce current loss relative to a conventional series current sensor.

3. The current balance circuit of claim 1, wherein the output signal sensed by the current sensing front end is a voltage signal.

4. The current balance circuit of claim 1, wherein the operation of the current sensing front end is phase independent.

5. The current balance circuit of claim 1, wherein the current sensing frontend comprises an inductor and first resistor coupled in series and a second resistor and capacitor coupled in series.

6. The current balance circuit of claim 5, wherein the current sensing frontend is configured such that the product of the values for the second resistor and capacitor is substantially equal to the ratio of the values for the inductor relative to the first resistor.

7. The current balance circuit of claim 1, wherein the calibration value is communicated to the corresponding switching regulator via a feedback loop with the switching regulator.

8. The current balance circuit of claim 1, wherein the calibration circuit is a sawtooth calibration circuit that outputs a voltage offset.

9. The current balance circuit of claim 8, wherein the voltage offset applies a positive DC offset to the input voltage of the corresponding switching regulator to increase the positive duty cycle of the voltage and decrease the corresponding current or applies a negative DC offset to the input voltage of the corresponding switching regulator to decrease the positive duty cycle of the voltage and increase the corresponding current.

10. An electronic circuit comprising:
a plurality of switching regulators coupled together in parallel, the plurality of switching regulators have a corresponding operation phase; and
a current balance circuit for balancing the current output by each of the switching regulators, the current balance circuit comprising:
a current sensing front end for sensing an output voltage from each of a plurality of switching regulators;
a current sensor for receiving the sensed output voltage from each of the switching regulators and converting the sensed output voltage into a sensed current signal corresponding to an indication of the output current of the respective switching regulator;
a current averaging circuit for receiving the sensed output signal from each of the switching regulators and determining an average current output for the plurality of switching regulators by using a plurality of current summation transistors to sum the sensed output signal from the plurality of switching regulators and a current mirror configured to determine the average current output;
a current difference circuit for receiving the average current value from the current averaging circuit and the sensed current signals and determining a current difference relative to the average current for each of the plurality of switching regulators; and
a sawtooth calibration circuit for receiving the current differences and generating a corresponding voltage value for calculating a voltage offset corresponding to each of the plurality of switching regulators, the voltage offset providing an indication of how to adjust a current output of the plurality of switching regulators such that the output current is balanced across the plurality of switching regulators.

11. The electronic circuit of claim 10, wherein the current sensing frontend and the current sensor are configured to reduce current loss relative to a conventional series current sensor.

12. The electronic circuit of claim 10, wherein the operation of the current sensing front end is phase independent.

13. The electronic circuit of claim 10, wherein the current sensing frontend comprises an inductor and first resistor coupled in series and a second resistor and capacitor coupled in series.

14. The electronic circuit of claim 13, wherein the current sensing frontend is configured such that the product of the values for the second resistor and capacitor is substantially equal to the ratio of the values for the inductor relative to the first resistor.

15. A method for balancing the current between multiple phases in a multiple phase switching regulator comprising:
sensing a current from each of a plurality of switching regulators to obtain a sensed current value for each of the plurality of switching regulators;
summing and averaging the sensed current from each of the plurality of switching regulators to obtain an average sensed current corresponding to the average current sensed from the plurality of switching regulators, wherein the average current is determined using a plurality of current summation transistors to sum the sensed output signal from the plurality of switching regulators and a current mirror configured to determine the average current output;
determining a voltage value corresponding to a current difference between the averaged sensed current and the sensed current for each of the plurality of switching regulators;
adjusting a calibration value for each of the plurality of switching regulators based at least in part on the voltage calculated for the respective plurality of switching regulators; and
communicating the calibration value to the corresponding switching regulator.

16. The method of claim 15, wherein the current from each of the plurality of switching regulators is sensed using a circuit configured to reduce current loss relative to a conventional series current sensor.

17. The method of claim 15, wherein the sensing the current is phase independent.

18. The method of claim 15, wherein the current from each of the plurality of switching regulators is sensed using a circuit comprising an inductor and first resistor coupled in series and a second resistor and capacitor coupled in series.

19. The method of claim 18, wherein the circuit for sensing the current is configured such that the product of the values for the second resistor and capacitor is substantially equal to the ratio of the values for the inductor relative to the first resistor.

20. The method of claim 15, wherein the calibration value is a voltage offset for a sawtooth calibration circuit and the voltage offset applies a positive DC offset to the input voltage of the corresponding switching regulator to increase the positive duty cycle of the voltage and decrease the corresponding current or applies a negative DC offset to the input voltage of the corresponding switching regulator to decrease the positive duty cycle of the voltage and increase the corresponding current.

* * * * *